(12) United States Patent
Abbott et al.

(10) Patent No.: US 6,900,494 B2
(45) Date of Patent: May 31, 2005

(54) METHOD OF USING HIGH-K DIELECTRIC MATERIALS TO REDUCE SOFT ERRORS IN SRAM MEMORY CELLS, AND A DEVICE COMPRISING SAME

(75) Inventors: Todd R. Abbott, Boise, ID (US); Mike Violette, Boise, ID (US); Zhongze Wang, Boise, ID (US); Jigish D. Trevidi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/780,014

(22) Filed: Feb. 17, 2004

(65) Prior Publication Data

US 2004/0159895 A1 Aug. 19, 2004

Related U.S. Application Data

(62) Division of application No. 10/191,833, filed on Jul. 9, 2002, now Pat. No. 6,723,597.

(51) Int. Cl.[7] .............................................. H01L 29/76
(52) U.S. Cl. ..................... 257/297; 257/368; 257/382; 257/760
(58) Field of Search ................................ 257/288, 296, 257/297, 368, 382, 750, 752, 758, 760

(56) References Cited

U.S. PATENT DOCUMENTS

| | | | |
|---|---|---|---|
| 5,675,185 A | 10/1997 | Chen et al. ................. 257/774 |
| 5,792,703 A | 8/1998 | Bronner et al. ............. 438/620 |
| 5,872,033 A | 2/1999 | Figura ........................ 438/255 |
| 5,877,051 A | 3/1999 | Manning .................... 438/238 |
| 5,989,946 A | 11/1999 | Honeycutt .................. 438/153 |
| 6,140,672 A | * 10/2000 | Arita et al. .................. 257/295 |
| 6,172,387 B1 | 1/2001 | Thakur et al. .............. 257/296 |
| 6,291,331 B1 | 9/2001 | Wang et al. ................. 438/618 |
| 6,326,301 B1 | * 12/2001 | Venkatesan et al. ........ 438/638 |
| 6,339,550 B1 | 1/2002 | Wanlass ................ 365/189.01 |
| 6,348,356 B1 | 2/2002 | Shabde et al. ............... 438/14 |
| 6,351,151 B2 | 2/2002 | Kumar et al. ................. 326/98 |
| 6,376,358 B1 | 4/2002 | Fischer et al. .............. 438/621 |
| 6,459,117 B1 | * 10/2002 | Liou .......................... 257/306 |
| 6,509,270 B1 | * 1/2003 | Held .......................... 438/691 |
| 6,534,866 B1 | 3/2003 | Trivedi et al. .............. 257/752 |
| 6,630,395 B1 | 10/2003 | Kane et al. ................. 438/622 |
| 2003/0071361 A1 | 4/2003 | Kane et al. ................. 257/774 |

* cited by examiner

*Primary Examiner*—T. N. Quach
(74) *Attorney, Agent, or Firm*—Williams, Morgan & Amerson, P.C.

(57) ABSTRACT

The method comprises forming a layer comprised of BPSG above a substrate and a plurality of transistors, forming a dielectric layer above the BPSG layer, the dielectric layer comprised of a material having a dielectric constant greater than approximately 6.0, forming a plurality of openings in the dielectric layer and the BPSG layer, each of the openings allowing contact to a doped region of one of the transistors, and forming a conductive local interconnect in each of the openings. In another embodiment, the method comprises forming a layer comprised of BPSG above the substrate and between the transistors, forming a local interconnect in openings formed in the BPSG layer, reducing a thickness of the BPSG layer after the local interconnects are formed, and forming a dielectric layer above the BPSG layer and between the local interconnects, wherein the dielectric layer has a dielectric constant greater than approximately 6.0.

18 Claims, 5 Drawing Sheets

METHOD OF USING HIGH-K DIELECTRIC MATERIALS TO REDUCE SOFT ERRORS IN SRAM MEMORY CELLS, AND A DEVICE COMPRISING SAME

CROSS-REFERENCE TO RELATED APPLICATION

This is a divisional of application Ser. No. 10/191,833 filed Jul. 9, 2002 now U.S. Pat. No. 6,723,597.

BACKGROUND OF THE INVENTION

1. Field of the Invention

This present invention is generally directed to the field of integrated circuits and semiconductor processing, and, more particularly, to a method of using high-k dielectric materials to reduce soft errors in static random access memory (SRAM) memory cells, and a device comprising same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. In general, modern integrated circuit devices and applications mandate high-performance memory structures to aide in processing and storing the vast volume of data processed by such devices. Thus, as the integration density and processing power of various integrated circuit devices has increased, e.g., application-specific circuits, microprocessors, etc., efforts have been made to increase the density and operating speed of such memory structures.

Relatively speaking, an SRAM memory cell provides a very fast read access speed. Accordingly, SRAM cells are widely used in integrated circuits. An SRAM cell is considered to be a bi-stable circuit because it has two stable or self-maintaining operating states that correspond to two different output voltages, or logic states. Typically, the different voltages correspond to a binary stored "1" (logically high) or "0" (logically low). Without external stimuli, an SRAM memory cell will operate continuously in a single one of its two operating states. It has internal feedback to maintain a stable voltage differential between two nodes of the cell. The polarity of this voltage difference is sensed by external circuitry to determine the operating state of the SRAM cell. The two possible output voltages produced by an SRAM cell are typically determined by the upper and lower circuit supply voltages.

FIG. 1 is a cross-sectional view of a portion of an illustrative SRAM cell 10 formed above a semiconducting substrate 12, such as silicon. The SRAM cell 10 is generally comprised of two transistors 16, each of which is comprised of a gate insulation layer 17, a gate electrode 19, a protective cap layer 21, and a plurality of source/drain regions 15. The transistors 16 are formed between isolation structures 14 formed in the substrate 12. Typically, a plurality of local interconnects 13 are formed in a BPSG (boron phosphosilicate glass) layer 11. The BPSG layer 11 may be formed by a variety of deposition techniques, e.g., chemical vapor deposition ("CVD"), plasma enhanced chemical vapor deposition ("PECVD"), etc. The thickness of the BPSG layer 11 may vary depending upon the device under construction. Typically, the BPSG layer 11 may have a thickness that ranges from approximately 500–1000 nm (5000–10000 Å). More importantly, in traditional SRAM cells, the local interconnects 13 are positioned within the insulating BPSG layer 11. Typically, the BPSG layer 11 will be deposited and a plurality of openings 25 will be formed therein by performing known photolithography and etching techniques. Thereafter, the local interconnects 13 will be formed in the openings 25 in the BPSG layer 11.

Alpha particles are naturally occurring ionizing radiation which can penetrate into the silicon substrate of the SRAM cell 10 depicted in FIG. 1 and generate electron-hole pairs. One source of alpha particles is the decay of radioactive impurities such as uranium or thorium, known to be present in trace levels in common semiconductor packaging materials. The alpha particles, from whatever source, can generate sufficient charge adjacent an SRAM memory cell node to upset the data state of the SRAM memory cell, i.e., it can cause the SRAM cell 10 to flip from a "1" to a "0," or vice versa. Such events are termed "soft errors" in the industry. Soft error rates must be controlled to very low levels for reliable operation of semiconductor devices.

Typically, the boron element used in the BPSG layer 11 is $B_{10}$, which has a relatively large capture cross-section. As a result, the alpha particles striking the BPSG layer 11 (comprised of $B_{10}$) tend to split and enter the silicon with the tendency to thereby cause soft errors. To counteract this problem, efforts have been made to replace the BPSG layer 11 with phosphosilicate glass (PSG), i.e., to eliminate the use of $B_{10}$, or to replace the $B_{10}$ material with $B_{11}$, a version of boron that has a smaller capture cross-section. Despite these efforts, soft errors in SRAM memory cells continue to be a problem that must be addressed. This is particularly important for integrated circuit devices intended for use in space applications or satellite communications.

The present invention is directed to a device and various methods that may solve, or at least reduce, some or all of the aforementioned problems.

SUMMARY OF THE INVENTION

The present invention is generally directed to a method of using high-k dielectric materials to reduce soft errors in SRAM devices, and a device comprising same. In one illustrative embodiment, the method comprises forming a plurality of transistors above a semiconducting substrate, forming a layer comprised of boron phosphosilicate glass (BPSG) above the substrate and the transistors, forming a dielectric layer above the BPSG layer, the dielectric layer comprised of a material having a dielectric constant greater than approximately 6.0, forming a plurality of openings in the dielectric layer and the BPSG layer, each of the openings allowing contact to a doped region of one of the transistors, and forming a conductive local interconnect (LI) in each of the openings.

In another illustrative embodiment, the method comprises forming a plurality of transistors above a semiconducting substrate, forming a layer comprised of boron phosphosilicate glass (BPSG) above the substrate and between the transistors, forming a plurality of openings in the BPSG layer, each of the openings allowing contact to a doped region of one of the transistors, forming a conductive local interconnect in each of the openings, reducing a thickness of the BPSG layer after the local interconnects are formed, and forming a dielectric layer above the BPSG layer and between the local interconnects.

In yet another illustrative embodiment, a memory cell is provided that comprises a plurality of transistors formed above a semiconducting substrate and a plurality of local interconnects, each of which is conductively coupled to a doped region, i.e., a source/drain region, of one of the transistors. The local interconnects are positioned in openings in a layer of boron phosphosilicate glass (BPSG) and a dielectric layer positioned above the BPSG layer, the dielectric layer being comprised of a material having a dielectric constant greater than approximately 6.0.

BRIEF DESCRIPTION OF THE DRAWINGS

The invention may be understood by reference to the following description taken in conjunction with the accompanying drawings, in which like reference numerals identify like elements, and in which.

Figure 1:
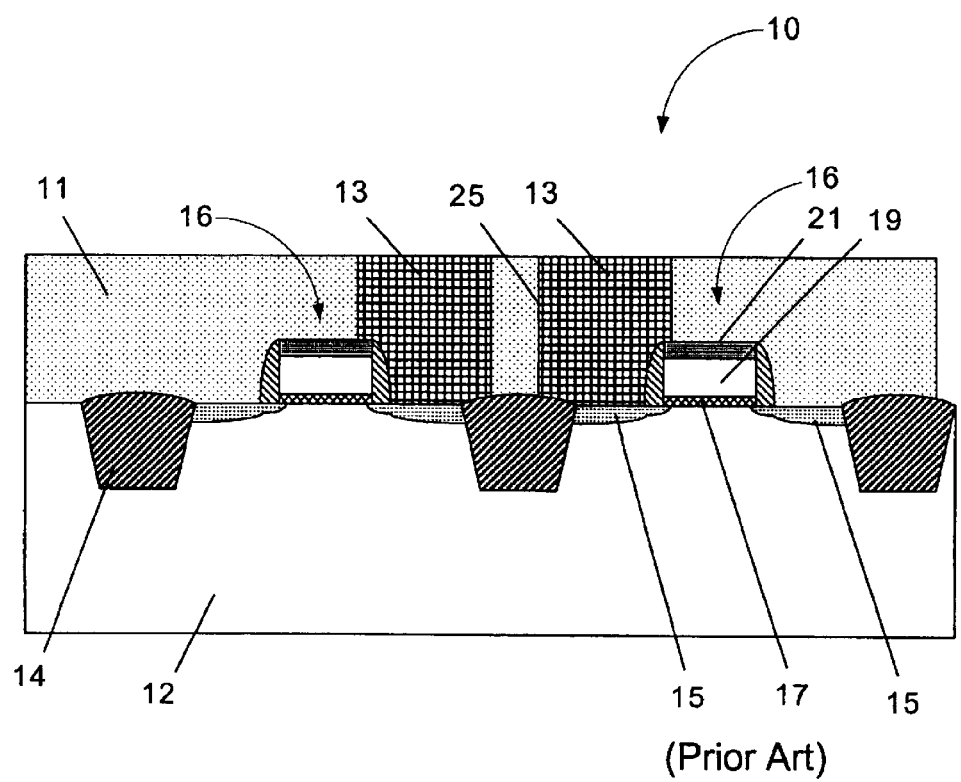
FIG. 1 is a cross-sectional view of an illustrative prior art SRAM device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
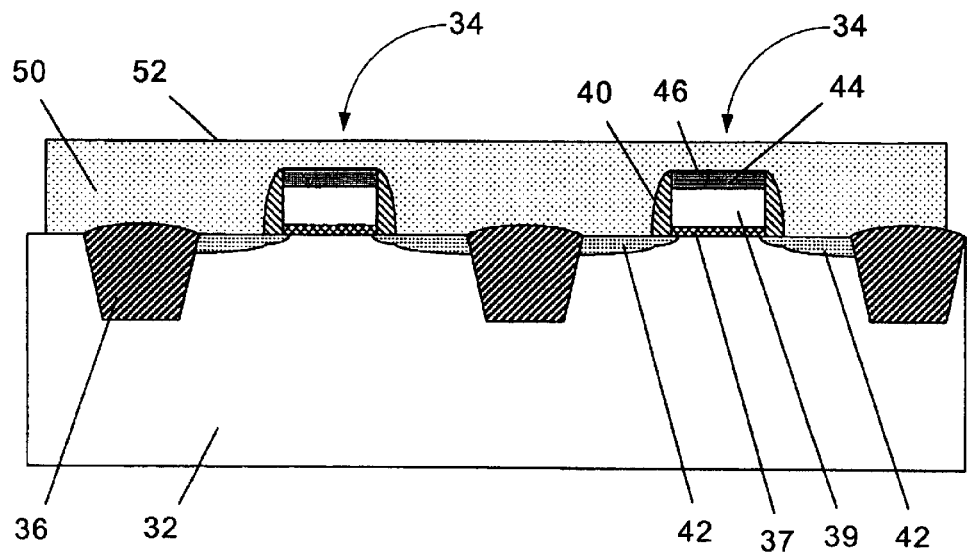
FIGS. 2A–2D depict one illustrative process flow that may be performed in accordance with one embodiment of the present invention.

One illustrative process flow that may be employed to manufacture an integrated circuit device in accordance with one embodiment of the present invention is depicted in FIGS. 2A–2D. As shown therein, an illustrative SRAM cell 30 (see FIG. 2D) is formed above a semiconducting substrate 32. As shown in FIG. 2A, the process begins with the formation of a plurality of transistors 34 above the substrate 32 between isolation regions 36 formed in the substrate 32. In general, the transistors 34 are comprised of a gate insulation layer 37, a gate electrode 39, sidewall spacers 40, and source/drain regions 42. A protective cap layer 44 is formed above the gate electrode 39. The various components just described may be formed by a variety of known techniques, and they may be comprised of a variety of known materials. For example, the gate insulation layer 37 may be comprised of a thermally grown layer of silicon dioxide. The gate electrode 39 may be comprised of a doped polycrystalline silicon (polysilicon), and the sidewall spacers 40 may be comprised of silicon nitride, or other like materials. The cap layer 44 may be comprised of silicon nitride or silicon dioxide made using TEOS. The source/drain regions 42 may be formed by performing one or more ion implant processes to implant the appropriate dopant atoms into the substrate. One or more anneal processes may then be performed to activate the implanted dopant material. The substrate 32 may be comprised of a variety of semiconducting materials, e.g., silicon, germanium, silicon-on-insulator (SOI) structures, etc. Thus, the composition of the components heretofore described and the manner of making such components should not be considered a limitation of the present invention.

The initial step in the illustrative embodiment of the present invention depicted in FIGS. 2A–2D involves the formation of a layer 50 of boron phosphosilicate glass (BPSG) above the transistors 34 and the substrate 32. The BPSG layer 50 may be formed by a variety of known deposition processes, e.g., chemical vapor deposition ("CVD"), plasma enhanced chemical vapor deposition ("PECVD"), etc. The thickness of the BPSG layer 50 may vary to some degree, but it will generally be significantly less than the BPSG layer described in the background section of the application. For example, in accordance with one embodiment of the present invention, the BPSG layer 50 may have a thickness that is approximately the same as the height of the gate stack, i.e., the combined height of the gate insulation layer 37, gate electrode 39 and protective cap layer 44. In one illustrative embodiment, the BPSG layer 50 has a thickness that ranges from approximately 150–200 nm (1500–2000 Å). In general, the thickness of the BPSG layer 50 will be such that the surface 52 of the BPSG layer 50 extends somewhat above the surface 46 of the protective cap layer 44, as shown in FIG. 2A. In one embodiment, the BPSG layer 50 will be deposited such that the upper surface 52 extends approximately 50–100 nm (500–1000 Å) above the upper surface 46 of the transistors. Alternatively, if desired, the surface 52 of the BPSG layer 50 may be deposited in such a manner that the surface 52 is approximately level with the surface 46 after the deposition process.

Figure 2B:
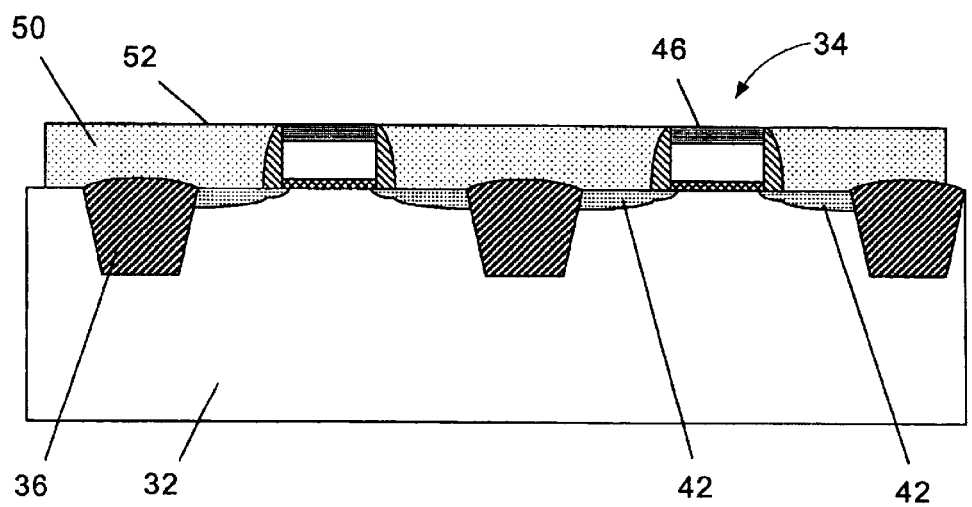

After the BPSG layer 50 is deposited, a typical reflow process may be performed on the BPSG layer 50. Then, traditional chemical mechanical polishing ("CMP") operations may be performed on the BPSG layer 50 until such time as the surface 52 of the BPSG layer 50 is approximately planar with the surface 46 of the protective cap layer 44, as shown in FIG. 2B.

Figure 2C:
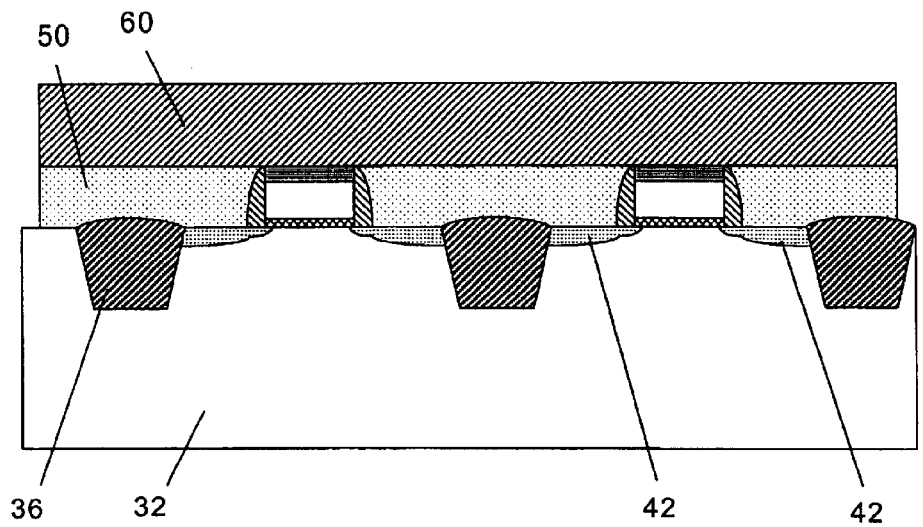

Referring to FIG. 2C, in this illustrative process flow, an insulating layer 60 comprised of a material having a relatively high dielectric constant, e.g., a dielectric constant greater than approximately 6.0 is formed above the BPSG layer 50. For example, the high-k dielectric layer 60 may be comprised of aluminum oxide ($Al_2O_3$) (k of approximately 12), tantalum pentoxide ($Ta_2O_5$) (k of approximately 12), hafnium oxide ($HfO_2$) (k of approximately 18, zirconium oxide ($ZrO_2$) (k of approximately 16), etc. The high-k dielectric layer 60 may be formed by a variety of techniques, e.g., CVD, PECVD, ALD, a spin coating process, etc. Moreover, the thickness of the high-k dielectric layer 60 may vary depending upon the overall height of the SRAM cell. For example, in one illustrative embodiment, the thickness of the high-k dielectric layer 60 may vary from approximately 300–850 nm (3000–8500 Å), depending upon the desired capacitance between the local interconnects.

Figure 2D:
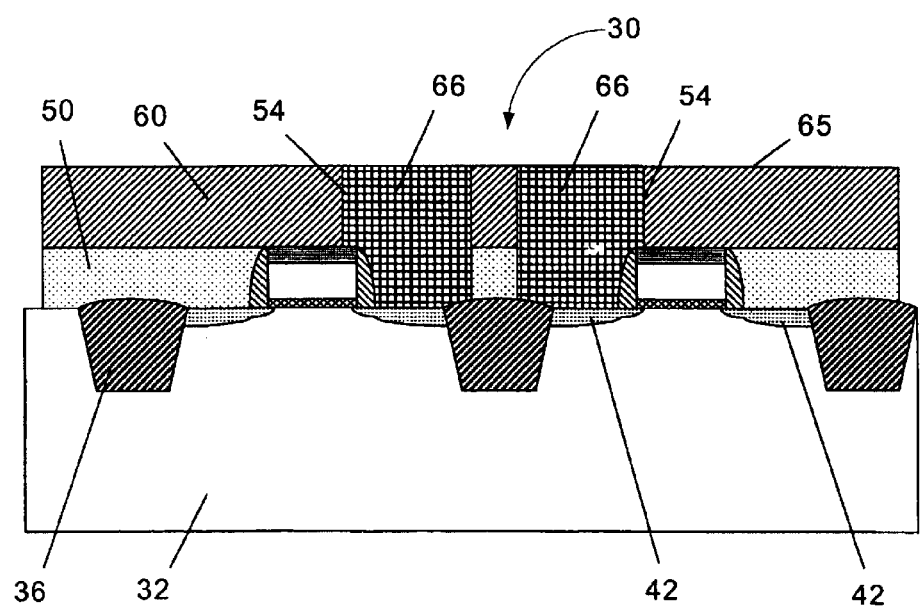

Next, as shown in FIG. 2D, a plurality of openings 54 are formed in the high-k dielectric layer 60 and the BPSG layer 50 using known photolithography and etching processes. For example, one or more anisotropic etching processes may be performed to pattern the high-k dielectric layer 60 and the BPSG layer 50. Thereafter, known processing techniques and materials are used to form local interconnects 66 in the openings 54. Typically, where the local interconnects 66 are comprised of tungsten, the process of forming the local interconnects 66 will involve the conformal deposition of a material such as titanium, followed by the conformal deposition of a material such as titanium nitride, and a blanket deposition of tungsten above the surface 65 of the high-k dielectric layer 60 and in the openings 54. Thereafter, one or more chemical mechanical polishing processes are performed to remove the excess material, i.e., the excess titanium, titanium nitride and tungsten, from above the surface 65 of the high-k dielectric layer 60. Note that the layers of titanium and titanium nitride are not depicted as part of the local interconnects 66 for purpose of clarity. Of course, as will be understood by those skilled in the art after a complete reading of the present application, the local interconnects 66 may be comprised of a variety of different materials, e.g., a metal, a metal alloy, copper, aluminum, tungsten, polysilicon, etc. As suggested, depending on the particular material or process chosen to form the interconnects 66, a barrier or other intermediate layer may be required or desired.

Figure 3A:
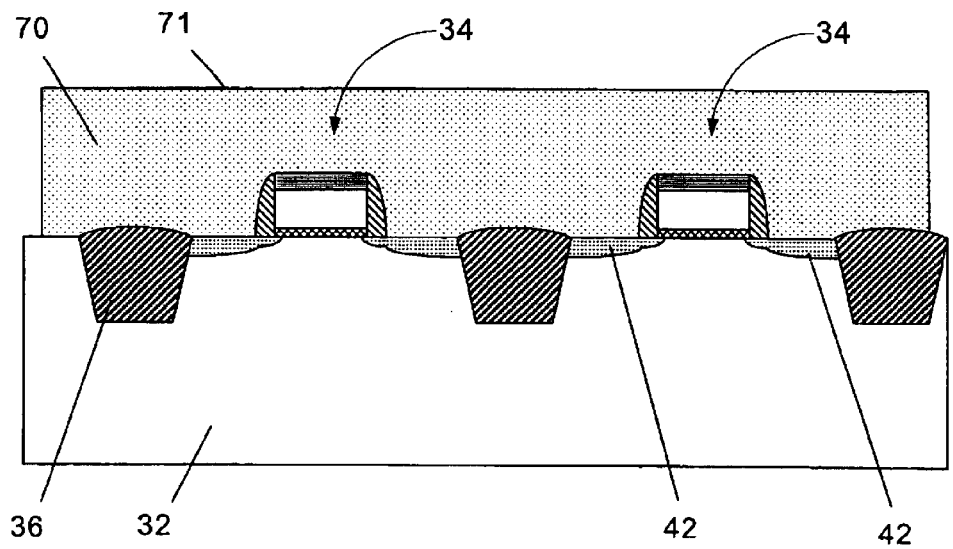
FIGS. 3A–3D depict another illustrative process flow that may be performed in accordance with one illustrative embodiment of the present invention.
Figure 3B:
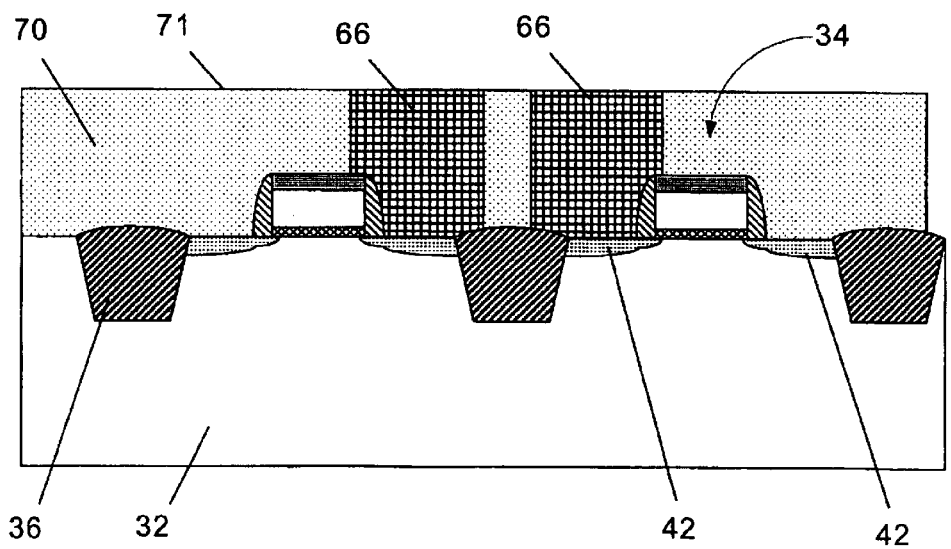

Another illustrative process flow that may be employed to manufacture an integrated circuit in accordance with one embodiment of the present invention is depicted in FIGS. 3A–3D. As shown therein, a BPSG layer 70 is formed above the semiconducting substrate 32 and transistors 34 in accordance with traditional processing techniques as described in the background section of this application. More specifically, the BPSG layer 70 has a sufficient thickness such that its upper surface 71 extends significantly above the top surface 46 of the protective cap layer 44 on the transistor 34. The BPSG layer 70 will be formed to a sufficient thickness such that a plurality of local interconnects 66 may be formed therein, as shown in FIG. 3B. In one illustrative embodiment, the BPSG layer 70 may have a thickness of approximately 500–1000 nm (5000–10000 Å), and it may be formed by a variety of deposition processes, e.g., CVD, PECVD, etc. The local interconnects 66 may be formed by a variety of known techniques, such as those previously described in the present application.

Thereafter, one or more etching processes are performed on the BPSG layer 70 to reduce the thickness of the BPSG layer 70. That is, the surface 71 of the BPSG layer 70 is lowered. In one illustrative embodiment, the etching process is performed for a sufficient duration such that the surface 71 of the BPSG layer 70 is approximately even with the top surface 46 of the protective cap layer 44 on the transistors 34. In general, the etching process may be performed to reduce the original thickness of the BPSG layer 70 by approximately 40–60%, depending upon the desired capacitance between the local interconnects. In one particularly illustrative embodiment, the final thickness of the BPSG layer 70 after the etching process is performed may range from approximately 150–200 nm (1500–2000 Å). A variety of anisotropic or isotropic etching processes may be employed to reduce the thickness of the BPSG layer 70, and such processes may be either wet or dry processes.

Figure 3C:
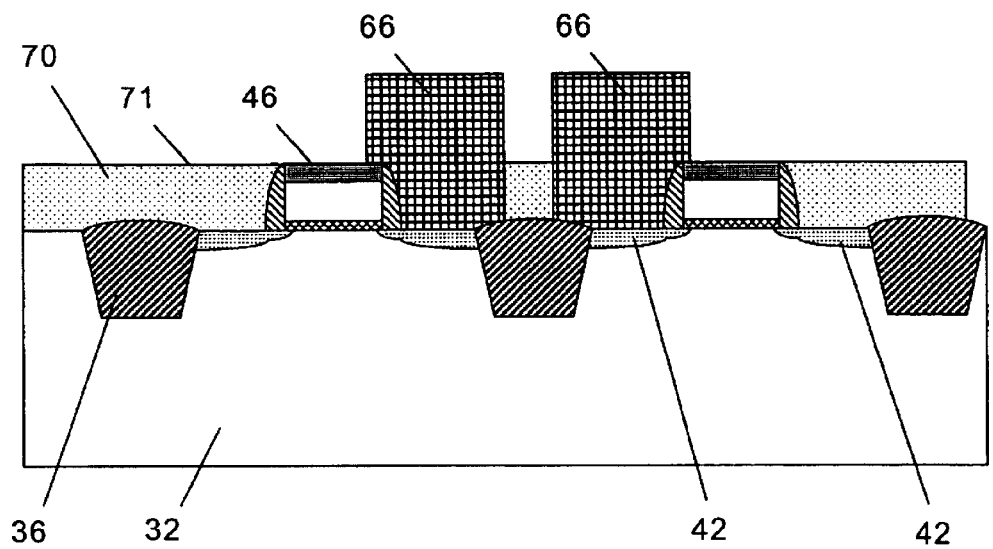
Figure 3D:
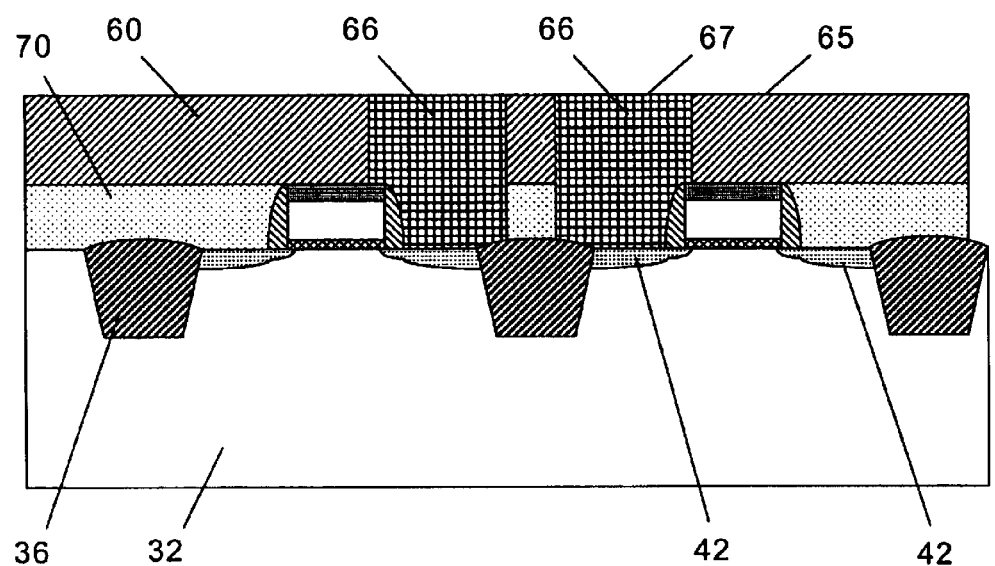

As shown in FIG. 3C, the reduction in thickness of the BPSG layer 70 exposes portions of the previously formed local interconnects 66. As indicated in FIG. 3D, the high-k dielectric layer 60 is then formed, e.g., by deposition, above the reduced-thickness BPSG layer 70 and between the previously formed local interconnects 66. A CMP process may be subsequently performed to insure that the upper surface 65 of the BPSG layer 60 is approximately planar with the upper surface 67 of the local interconnects 66. Thereafter, traditional processing operations are performed to complete the formation of the integrated circuit device.

The present invention is generally directed to a method of using high-k dielectric materials to reduce soft errors in SRAM devices, and a device comprising same. In one illustrative embodiment, the method comprises forming a plurality of transistors above a semiconducting substrate, forming a layer comprised of boron phosphosilicate glass (BPSG) above the substrate and the transistors, forming a dielectric layer above the BPSG layer, the dielectric layer comprised of a material having a dielectric constant greater than approximately 6.0, forming a plurality of openings in the dielectric layer and the BPSG layer, each of the openings allowing contact to a doped region of one of the transistors, and forming a local interconnect in each of the openings.

In another illustrative embodiment, the method comprises forming a plurality of transistors above a semiconducting substrate, forming a layer comprised of boron phosphosilicate glass (BPSG) above the substrate and between the transistors, forming a plurality of openings in the BPSG layer, each of the openings allowing contact to a doped region of one of the transistors, forming a local interconnect in each of the openings, reducing a thickness of the BPSG layer after the local interconnects are formed, and forming a dielectric layer above the BPSG layer and between the local interconnects.

In yet another illustrative embodiment, a memory cell is provided that comprises a plurality of transistors formed above a semiconducting substrate and a plurality of local interconnects, each of which is conductively coupled to a doped region, i.e., a source/drain region, of one of the transistors. Each of the local interconnects of the memory device is positioned in an opening in a layer of boron phosphosilicate glass (BPSG) and a dielectric layer positioned above the BPSG layer, the dielectric layer being comprised of a material having a dielectric constant greater than approximately 6.0. The memory cell of the present invention may be a part of a traditional memory array, or it may be included as a portion of another integrated product, such as a microprocessor, an application-specific circuit, etc.

Through use of the present invention, soft error rates in SRAM cells may be reduced. More specifically, as the size of SRAM cells shrinks, the cell capacitance also drops.

Since the charge stored on each node is equal to Ccell*Vcc, the charge stored also drops substantially. This makes the SRAM cell prone to soft error failure. Soft error is caused by alpha particle hitting junction area creating free charges. If the free charges are greater than the charge stored on an SRAM cell node, the cell will flip. By replacing a portion of the current BPSG local interconnect stack with a relatively high-k dielectric (e.g., $Al_2O_3$, $Ta_2O_5$, etc.), adjacent local interconnects are now more coupled through increased capacitance. As a result, Ccell is increased and there is less chance of the cell flipping states.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory cell, comprising:
    a plurality of transistors formed above a semiconducting substrate, each of said transistors comprised of a plurality of doped regions formed in said substrate; and
    a plurality of local interconnects, each of which are conductively coupled to a doped region of one of said transistors and positioned in an opening in a layer of boron phosphosilicate glass (BPSG) and a dielectric layer positioned above said BPSG layer, said dielectric layer being comprised of a material having a dielectric constant greater than approximately 6.0.

2. The memory cell of claim 1, said semiconducting substrate is comprised of silicon.

3. The memory cell of claim 1, wherein said doped regions are source/drain regions.

4. The memory cell of claim 1, wherein said BPSG layer has a thickness of approximately 150–200 nm.

5. The memory cell of claim 1, wherein said dielectric layer is comprised of at least one of aluminum oxide, tantalum pentoxide, hafnium oxide and zirconium oxide.

6. The memory cell of claim 1, wherein said local interconnect is comprised of at least one of a metal, a metal alloy, tungsten, copper, aluminum and polysilicon.

7. The memory cell of claim 1, wherein said dielectric layer has a thickness that ranges from approximately 300–850 nm.

8. The memory cell of claim 1, wherein said dielectric layer is positioned on said BPSG layer.

9. A memory cell, comprising:
    a plurality of transistors formed above a semiconducting substrate comprised of silicon, each of said transistors comprised of a plurality of doped regions formed in said substrate; and
    a plurality of local interconnects, each of which are conductively coupled to a doped region of one of said transistors and positioned in an opening in a layer of boron phosphosilicate glass (BPSG) and a dielectric layer positioned on said BPSG layer, said dielectric layer being comprised of a material having a dielectric constant greater than approximately 6.0.

10. The memory cell of claim 9, wherein said doped regions are source/drain regions.

11. The memory cell of claim 9, wherein said BPSG layer has a thickness of approximately 150–200 nm.

12. The memory cell of claim 9, wherein said dielectric layer is comprised of at least one of aluminum oxide, tantalum pentoxide, hafnium oxide and zirconium oxide.

13. The memory cell of claim 9, wherein said local interconnect is comprised of at least one of a metal, a metal alloy, tungsten, copper, aluminum and polysilicon.

14. The memory cell of claim 9, wherein said dielectric layer has a thickness that ranges from approximately 300–850 nm.

15. A memory cell, comprising:
    a plurality of transistors formed above a semiconducting substrate comprised of silicon, each of said transistors comprised of a plurality of doped regions formed in said substrate; and
    a plurality of local interconnects comprised of at least one of a metal, a metal alloy, tungsten, copper, aluminum and polysilicon, each of which are conductively coupled to a doped region of one of said transistors and positioned in an opening in a layer of boron phosphosilicate glass (BPSG) and a dielectric layer positioned on said BPSG layer, said dielectric layer being comprised of at least one of aluminum oxide, tantalum pentoxide, hafnium oxide and zirconium oxide.

16. The memory cell of claim 15, wherein said doped regions are source/drain regions.

17. The memory cell of claim 15, wherein said BPSG layer has a thickness of approximately 150–200 nm.

18. The memory cell of claim 15, wherein said dielectric layer has a thickness that ranges from approximately 300–850 nm.

* * * * *

UNITED STATES PATENT AND TRADEMARK OFFICE
CERTIFICATE OF CORRECTION

PATENT NO. : 6,900,494 B2
DATED : May 31, 2005
INVENTOR(S) : Todd R. Abbott et al.

It is certified that error appears in the above-identified patent and that said Letters Patent is hereby corrected as shown below:

Column 7,
Line 36, before "said" insert -- wherein --.

Signed and Sealed this

Nineteenth Day of July, 2005

JON W. DUDAS
*Director of the United States Patent and Trademark Office*